United States Patent [19]
Hayashi

[11] Patent Number: 4,716,332
[45] Date of Patent: Dec. 29, 1987

[54] PIEZOELECTRIC VIBRATOR

[75] Inventor: Hitoaki Hayashi, Tokyo, Japan

[73] Assignee: Asahi Dempa Co., Ltd., Tokyo, Japan

[21] Appl. No.: 872,014

[22] Filed: Jun. 9, 1986

[30] Foreign Application Priority Data

Mar. 31, 1986 [JP] Japan .................................. 61-70953

[51] Int. Cl.$^4$ ............................................ H01L 41/08
[52] U.S. Cl. .................................... 310/368; 310/312; 310/365; 310/369
[58] Field of Search ............... 310/312, 365, 360, 361, 310/367–369

[56] References Cited

U.S. PATENT DOCUMENTS

| | | | |
|---|---|---|---|
| 1,967,839 | 7/1934 | Osnos .................... | 310/367 |
| 2,343,059 | 2/1944 | Hight .................... | 310/368 X |
| 3,020,424 | 2/1962 | Bechmann ............... | 310/367 |
| 3,074,034 | 1/1963 | Crownover ............. | 310/369 X |
| 3,076,903 | 2/1963 | Schwartz ................ | 310/367 X |
| 3,382,381 | 5/1968 | Horton ................... | 310/365 X |
| 4,114,062 | 9/1978 | Mattuschka ............. | 310/368 X |
| 4,123,680 | 10/1978 | Kemper et al. .......... | 310/367 X |
| 4,188,557 | 2/1980 | Mattuschka ............. | 310/368 |
| 4,357,554 | 11/1982 | Peters .................... | 310/367 |
| 4,454,443 | 6/1984 | Lukaszek et al. ........ | 310/348 |
| 4,511,820 | 4/1985 | MacKenzie ............. | 310/369 |

FOREIGN PATENT DOCUMENTS

| | | |
|---|---|---|
| 2702106 | 8/1977 | Fed. Rep. of Germany ...... 310/312 |
| 2805491 | 8/1978 | Fed. Rep. of Germany . |
| 2828048 | 1/1979 | Fed. Rep. of Germany ...... 310/312 |
| 2806435 | 5/1979 | Fed. Rep. of Germany ...... 310/368 |
| 2847944 | 5/1980 | Fed. Rep. of Germany . |
| 2917598 | 11/1980 | Fed. Rep. of Germany . |
| 45-20226 | 7/1970 | Japan .................................. 310/365 |
| 0053688 | 4/1977 | Japan .................................. 310/367 |
| 0079396 | 7/1978 | Japan .................................. 310/312 |
| 0027733 | 2/1980 | Japan .................................. 310/312 |
| 0168418 | 12/1981 | Japan .................................. 310/348 |
| 2037070 | 7/1980 | United Kingdom ................ 310/361 |

*Primary Examiner*—Mark O. Budd
*Attorney, Agent, or Firm*—Stevens, Davis, Miller & Mosher

[57] ABSTRACT

A piezoelectric vibrator of thickness-shear mode including a vibrating plate made of AT-cut quartz and a pair of electrodes applied on major surfaces of the vibrating plate in opposition to each other. A part of a contour of the vibrating plate is made closer to the electrode by cutting off a corner of a square vibrating plate. An impedance of the piezoelectric vibrator for a fundamental vibration is extremely increased to suppress the fundamental vibration and thus the piezoelectric vibrator can vibrate stably at a third overtone frequency.

5 Claims, 13 Drawing Figures

FIG._4A 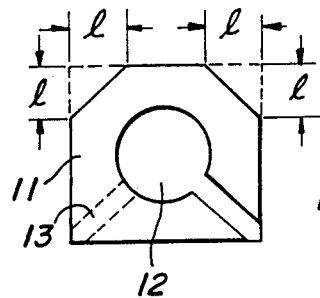 FIG._4B 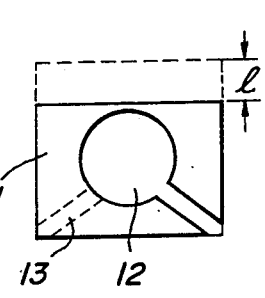 FIG._4C 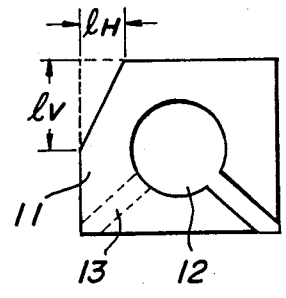
FIG._4D 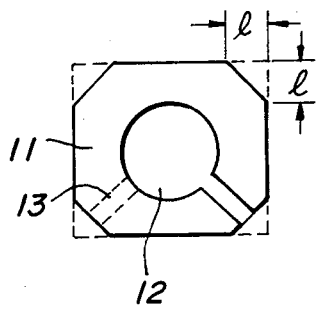 FIG._4E 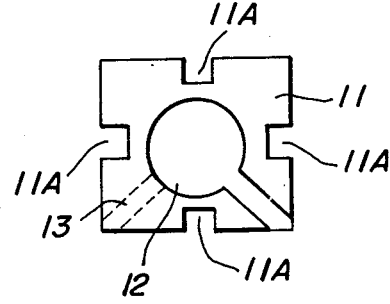
FIG._5A 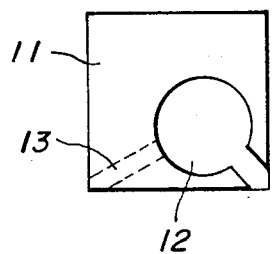 FIG._5B 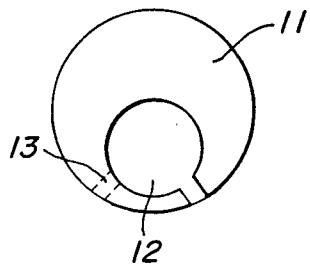

PIEZOELECTRIC VIBRATOR

BACKGROUND OF THE INVENTION

Field of the Invention and Related Art Statement

The present invention relates to a piezoelectric vibrator comprising a piezoelectric vibrating plate and a pair of electrodes applied on opposite surfaces of the piezoelectric vibrating plate, and more particularly to a piezoelectric vibrator for generating dominantly overtone vibrations in a thickness-slide mode.

In piezoelectric vibrators, there are various modes such as flexure vibration, thickness-extensional vibration and thickness-shear vibration. In order to generate a vibration frequency higher than megahertz order, it is generally used the thickness-shear vibration mode. A fundamental frequency of the thickness-shear vibration is inversely proportional to a thickness of a piezoelectric vibrating plate made of piezoelectric material. For instance, in case of using a quartz vibrating plate of AT-cut, a fundamental frequency of 10 MHz is obtained by using a vibrating plate having a thickness of 0.167 mm and a fundamental frequency of 30 MHz is generated by using a vibrating plate having a thickness of 0.056 mm. Therefore, when it is required to provide a piezoelectric vibrator for generating a higher frequency, it is necessary to use the vibrating plate having a smaller thickness. However, it is practically difficult to manufacture the vibrating plate having a thickness smaller than 0.1 mm with high precision and high yield. Therefore, it has been general to utilize overtone, for example, third overtone in order to obtain a frequency higher than 20 MHz.

In general, the piezoelectric vibrator may oscillate at either one of the fundamental frequency and the third overtone frequency. Therefore, in order to vibrate the piezoelectric vibrator at a desired overtone frequency, it is usual to adjust variable coil or capacitor provided in an oscillator circuit having a frequency selecting property. This will be explained more in detail with reference to FIG. 1.

FIG. 1 is an equivalent circuit of a piezoelectric vibrator 1 and an oscillator circuit 2 connected to the piezoelectric vibrator. Across the piezoelectric vibrator 1 there are connected serially an effective load resistance 3 and an effective load capacitance 4 of the oscillator circuit 2. In order to vibrate the piezoelectric vibrator 1 positively, it is required to make the load resistance 3 sufficiently large as compared with a series resonance resistance of a series circuit composed of an impedance of the piezoelectric vibrator 1 and the load capacitance 4, the serial resonance resistance being termed as quivalent series resistance. Therefore, in order to vibrate the piezoelectric vibrator 1 of the thickness-shear mode at ab overtone frequency in a stable manner, an impedance of the piezoelectric vibrator 1 at the overtone frequency should be sufficiently smaller than that at the fundamental frequency.

However, in the known piezoelectric vibrators, a difference between the impedance at the overtone frequency and the impedance at the fundamental frequency is small. For instance, impedance of piezoelectric vibrators having square vibrating plates of 8 mm×8 mm and thickness of 0.21 mm at the fundamental frequency of 8 MHz and the third overtone frequency of 24 MHz are shown in the following Table 1.

TABLE 1

| No. | Impedance at fundamental frequency (Ω) | Impedance at third overtone frequency (Ω) |
|---|---|---|
| 1 | 26.1 | 15.6 |
| 2 | 26.9 | 15.8 |
| 3 | 26.8 | 25.4 |
| 4 | 21.5 | 19.2 |
| 5 | 27.2 | 17.3 |
| 6 | 20.6 | 17.4 |
| 7 | 24.7 | 22.1 |
| 8 | 26.4 | 16.4 |
| 9 | 29.2 | 30.1 |
| 10 | 20.0 | 17.7 |

As can be seen from the above Table 1, the impedance of the piezoelectric vibrator at the fundamental frequency and the impedance at the third overtone frequency differ from each other only slightly. Therefore, in the oscillator circuit including the known piezoelectric vibrator, the third overtone becomes unstable to stop the overtone vibration and begins to oscillate at the undesired fundamental frequency. Particularly, when the overtone is utilized in conjunction with C-MOS inverter and TTL inverter which have been developed recently, the piezoelectric vibrator could no more vibrate at a desired overtone frequency if characteristics of the vibrator and oscillation circuit change slightly.

SUMMARY OF THE INVENTION

The present invention has for its object to provide a novel and useful piezoelectric vibrator of thickness-shear mode which can vibrate at a desired overtone frequency stably, while vibration at a fundamental frequency can be selectively suppressed.

According to the invention, in a piezoelectric vibrator vibrating at an overtone frequency comprising a vibrating plate made of piezoelectric material and having opposite major surfaces and a pair of electrodes applied on said major surfaces of the vibrating plate in opposition to each other, the improvement being characterized in that at least a portion of a contour of the vibrating plate is locally made closer to contours of the electrodes.

In the piezoelectric vibrator according to the present invention, an impedance at the fundamental frequency becomes extremely large, while an impedance at the overtone frequency is not substantially increased or is increased only slightly, so that the fundamental vibration is suppressed to a great extent and the piezoelectric vibrator can vibrate stably at the desired overtone frequency.

According to the invention, the contour of the vibrating plate may be made closer to the contours of the electrodes by means of various methods as explained later. In a preferable embodiment, a part of the contour of the vibrating plate is cut off, so that a center of gravity of the vibrating plate is made eccentric with respect to a center of gravity of the electrode. Such embodiment is particularly suitable in view of characteristics and manufacturing process.

Further, according to the invention, the impedance of the piezoelectric vibrator at the fundamental frequency may be selectively increased by uniformly reducing a dimension of the vibrating plate with respect to the electrodes.

BRIEF DESCRIPTION OF THE DRAWINGS

FIGS. 4A to 4E are front views depicting several embodiments of the piezoelectric vibrator according to the invention;

FIGS. 5A and 5B are front views illustrating another embodiments of the piezoelectric vibrator according to the invention;

DESCRIPTION OF THE PREFERRED EMBODIMENTS

Figure 1:
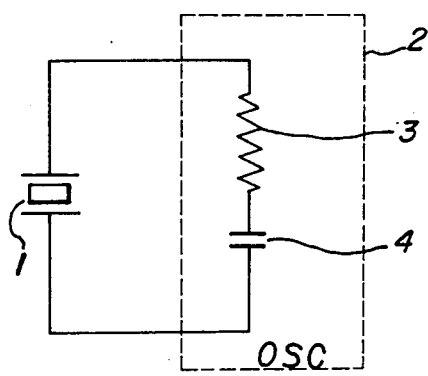
FIG. 1 is an equivalent circuit showing an oscillator comprising a piezoelectric vibrator.
Figure 2:
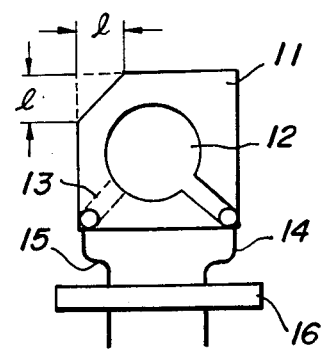
FIG. 2 is a front view illustrating an embodiment of the piezoelectric vibrator according to the invention.

FIG. 2 is a front view showing an embodiment of the piezoelectric vibrator according to the invention. The piezoelectric vibrator comprises a vibrating plate 11 made of AT-cut quartz having a thickness of 0.21 mm. The vibrating plate 11 has generally a square shape having a side of 8 mm. On front and rear major surfaces of the vibrating plate 11 are applied circular electrodes 12 and 13 in opposition to each other. In FIG. 2, the electrode 13 applied on the rear major surface of the vibrating plate 11 is not shown except for its lead portion. Lead wires 14 and 15 connected to the electrodes 12 and 13, respectively are supported by a stem 16 made of electrically insulating material. In the present embodiment, one corner of the vibrating plate 11 is cut off along an inclined line, so that a part of a contour of the vibrating plate is made closer to contours of the electrodes 12 and 13. In this configuration, a center of gravity of the vibrating plate 11 is made eccentric with respect to a center of gravity of the electrodes 12, 13.

In the present embodiment, the corner of the vibrating plate 11 is cut off in such a manner that a portion of the vibrating plate having rectangular isosceles triangle having a side of l mm is removed. The impedances of the piezoelectric transducer at the fundamental frequency and third overtone frequency were measured while the length l was varied within a range of 0 to 4.0 mm. The impedance measurement was carried out with the aid of crystal impedance meter (CI meter), and the result is represented in the following Table 2.

TABLE 2

| l (mm) | Impedance at fundamental frequency (Ω) | Impedance at third overtone frequency (Ω) |
|---|---|---|
| 0 | 18.6 | 17.1 |
| 1.25 | 25.7 | 17.0 |
| 2.25 | 45.3 | 17.3 |
| 2.5 | 82.6 | 17.6 |
| 3.2 | 227 | 23.0 |
| 4.0 | ∞ | 30.5 |

Figure 3:
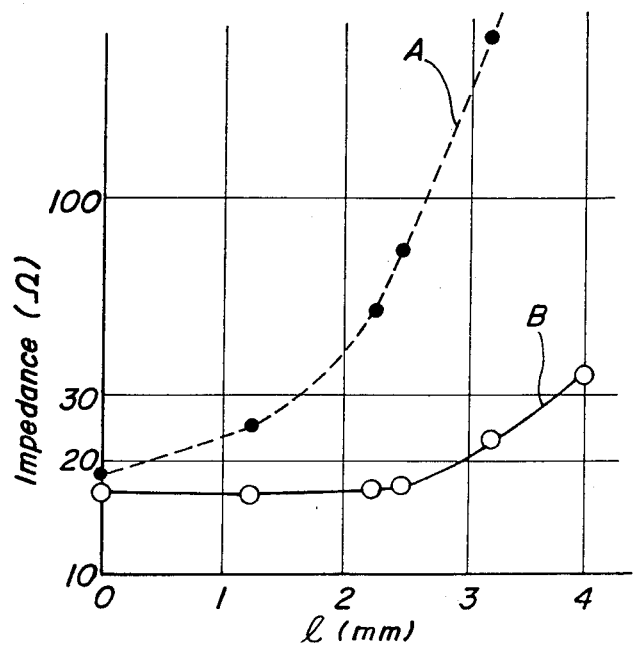
FIG. 3 is a graph explaining an operation of the piezoelectric vibrator shown in FIG. 2.

FIG. 2 shows curves of the impedance at the fundamental frequency and third overtone frequency. A curve A represents the impedance change at the fundamental frequency and a curve B denotes the impedance change at the third overtone frequency. As can be understood from the above Table 2 and the graph shown in FIG. 3, when the vibrating plate 11 is not cut off at its corner (i.e. l=0), the impedance of 18.6Ω for the fundamental vibration is substantially equal to the impedance of 17.1Ω for the third overtone. However, when the corner of the vibrating plate 11 is cut off, the impedance at the fundamental frequency is abruptly increased, while the impedance at the third overtone frequency is not substantially increased as long as the length l is smaller than 3 mm and is increased slightly although the length l exceeds 3 mm. In this manner, by cutting off the corner of the vibrating plate, it is possible make the impedance of the piezoelectric vibrator for the fundamental vibration extremely higher than the impedance for the third overtone vibration, so that the fundamental vibration is greatly suppressed and the piezoelectric vibrator can vibrate at the third overtone frequency in a stable manner.

FIGS. 4A to 4E are front views illustrating several embodiments of the piezoelectric vibrator according to the invention. In an embodiment shown in FIG. 4A, both corners of an upper side of a vibrating plate 11 are cut off along an inclined line, in an embodiment illustrated in FIG. 4B, an upper side of a vibrating plate 11 is totally cut off by a distance l, and in an embodiment shown in FIG. 4C a corner of the vibrating plate 11 is cut off in such a manner that a portion of the vibrating plate having a rectangular triangle shape with sides of lengths $l_H$ and $l_V$ ($l_H \neq l_V$) is removed. In these embodiments, a center of gravity of the vibrating plate is made eccentric with respect to a center of gravity of the electrode. In embodiments illustrated in FIGS. 4D and 4E, a center of gravity of the vibrating plate is concentric with a center of gravity of the electrode. In an embodiment illustrated in FIG. 4D, all four corners of a square vibrating plate 11 are cut off in a similar manner, and in an embodiment depicted in FIG. 4E, serrations 11A are formed at middle portions of all four sides of a square vibrating plate 11. According to the invention, the piezoelectric vibrator can vibrate stably at the third overtone frequency, while the fundamental vibration can be effectively and selectively suppressed, even if the center of gravity of the vibrating plate is made identical with that of the electrode.

FIGS. 5A and 5B are front views illustrating still another embodiments of the piezoelectric vibrator according to the invention in which the vibrating plate is not cut off at all. In an embodiment shown in FIG. 5A, electrodes 12 and 13 are formed on respective major surfaces of a square vibrating plate 11 at an off-center position, and in an embodiment of FIG. 5B electrodes 12 and 13 are formed on respective major surfaces of a circular vibrating plate 11 at an offcenter position. In these embodiments, a lower side of the vibrating plate 11 is locally made closer to the electrodes 12, 13, so that the fundamental vibration can be selectively suppressed to a great extent.

Now several examples of the piezoelectric vibrator according to the invention will be explained.

EXAMPLE 1

Figure 6:
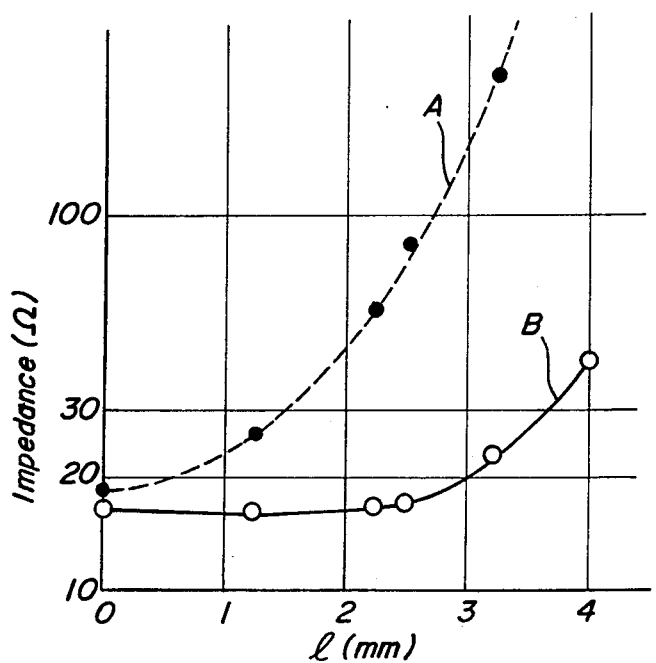
FIG. 6 is a graph representing impedance characteristic of the piezoelectric vibrator according to the invention.

A vibrating plate was formed by a square plate of AT-cut quartz having a thickness if 0.21 mm, a side of the square having a length of 8 mm. On both surfaces of the plate were applied circular electrodes having a diameter of 5 mm, while a center of gravity of the vibrating plate being made identical with a center of the circular electrodes. Then, both upper corners of the vibrating plate were gradually cut off as illustrated in FIG. 4A, while impedances of the vibrator for the fundamental vibration at 8 MHz and third overtone at 24 MHz were measured by the CI meter. The measured result is shown by curves A and B in FIG. 6. The curve A represents the impedance change at the fundamental frequency and the curve B denotes the impedance change at the third overtone frequency. The impedance for the fundamental vibration increases rapidly when the length l is longer than 1 mm. Contrary to this the impedance for the third overtone does not substantially change when the length l is shorter than about 2.5 mm. When the corners were cut off greatly (l≅4 mm), the impedance for the third overtone was increased only to about 40Ω which is extremely small as compared with the impedance for the fundamental vibration. Twenty piezoelectric vibrators having the upper corners cut off by l=3 mm were manufactured and were incorporated in an actual oscillator circuit. Then the piezoelectric vibrators were vibrated at the third overtone frequency of 24 MHz. All the piezoelectric vibrators operated stably at a nominal voltage of 5 V. Even if the voltage was reduced to 60% of the nominal value, i.e. 3 V, all the twenty piezoelectric vibrators vibrated at the third overtone frequency in a very stable manner.

EXAMPLE 2

Figure 7:
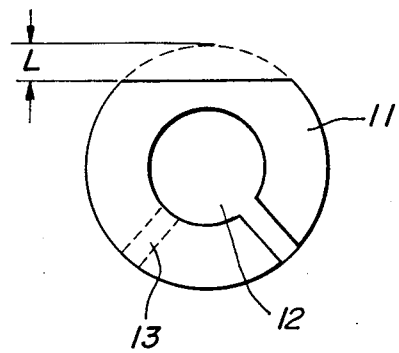
FIG. 7 is a front view showing still another embodiment of the piezoelectric vibrator according to the invention.
Figure 8:
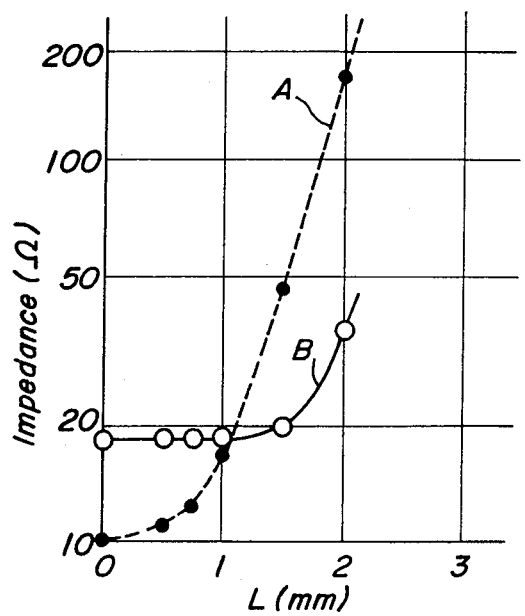
FIG. 8 is a graph showing impedance characteristic of the piezoelectric vibrator illustrated in FIG. 7.

As illustrated in FIG. 7, a vibrating plate 11 was made of a circular quartz plate having a thickness of 0.167 mm and a diameter of 8 mm. On respective major surfaces of the vibrating plate 11 were applied circular electrodes 12 and 13 having a diameter of 4 mm. Then a portion of a periphery of the vibrating plate 11 was cut off by a distance L. Impedance of the piezoelectric vibrator thus formed was measured with the aid of CI meter, while the distance L was changed from 0 to 2 mm. A curve A shown in FIG. 8 represents impedance change at a fundamental frequency of 10 MHz and a curve B expresses impedance change at a third overtone frequency of 30 MHz. The impedance for the fundamental vibration increases absurptly when the distance L exceeds 0.7 mm. The impedance for the third overtone does not substantially increase until the distance L amounts to 1.5 mm. It should be noted that the impedance for the fundamental vibration is lower than that for the third overtone as long as the distance L is shorter than 1 mm, but when the circular vibrating plate is cut off by the distance L more than 1 mm, the impedance for the third overtone becomes lower than that for the fundamental vibration. It has been confirmed experimentally that the piezoelectric vibrator can be vibrated at the third overtone frequency by selecting the distance L such that the impedance for the third overtone is smaller than a third of the impedance for the fundamental vibration.

Ten piezoelectric vibrators each having a periphery cut off by the distance L of 1.75 mm were manufactured and were incorporated into an actual oscillator circuit. All the ten piezoelectric vibrators operated stably at the third overtone frequency of 30 MHz and none of the piezoelectric vibrators did not vibrate at the fundamental frequency.

As explained above in detail, in the piezoelectric vibrator of thickness-shear mode according to the invention, the impedance at the fundamental frequency can be selectively increased to suppress the fundamental vibration to a great extent by simply bringing a part of the contour of the vibrating plate closer to the electrode. Therefore, the piezoelectric vibrator can stably vibrate at an overtone frequency. Such a piezoelectric vibrator can be advantageously utilized in various applications and can provide a remarkable progress in the related industry.

What is claimed is:

1. In a piezoelectric vibrator vibrating at a third overtone frequency comprising a vibrating plate made of piezoelectric material and having opposite major surfaces, and a pair of electrodes applied on said major surfaces in opposition to each other, the improvement wherein said vibrating plate comprises a substantially square plate having at least two adjacent corners cut off along oblique planes substantially perpendicular to said plate and spaced from an axis passing through a center of said plate, said plate has a center of gravity eccentric with respect to a center of gravity of each of said pairs of electrodes, and an impedance of the vibrator for said third overtone frequency is smaller than one-third of an impedance of a vibrator for a fundamental frequency, so that a fundamental vibration is suppressed and a third overtone vibration is enhanced.

2. A vibrator according to claim 1, wherein said vibrating plate is made of quartz.

3. A vibrator according to claim 1, wherein the vibrating plate has a thickness of about 0.21 mm and the piezoelectric vibrator is vibrated at the third overtone frequency of 24 MHz.

4. A vibrator according to claim 1, wherein the vibrating plate has a thickness of about 0.167 mm and the piezoelectric vibrator is vibrated at the third overtone frequency of 30 MHz.

5. The vibrator as in claim 1, wherein said adjacent corners are cut off symmetrically with respect to said axis passing through said center of said plate.

* * * * *